(12) United States Patent
Murphy

(10) Patent No.: US 7,229,855 B2
(45) Date of Patent: Jun. 12, 2007

(54) PROCESS FOR ASSEMBLING A DOUBLE-SIDED CIRCUIT COMPONENT

(75) Inventor: Ze Etta E. Murphy, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 304 days.

(21) Appl. No.: 10/906,518

(22) Filed: Feb. 23, 2005

(65) Prior Publication Data

US 2006/0189032 A1    Aug. 24, 2006

(51) Int. Cl.
*H01L 21/50* (2006.01)
*H01L 21/48* (2006.01)
*H01L 21/44* (2006.01)
*H01L 23/495* (2006.01)
*H01L 23/48* (2006.01)
*H01L 29/70* (2006.01)

(52) U.S. Cl. ........................ 438/123; 438/121; 438/106; 438/122; 257/673; 257/782; 257/578; 257/E21.499

(58) Field of Classification Search ................ 438/106, 438/121–123; 257/673, 782, 691, 578, E21.499
See application file for complete search history.

(56) References Cited

U.S. PATENT DOCUMENTS

| | | | | |
|---|---|---|---|---|
| 4,538,170 A | * | 8/1985 | Yerman | 257/705 |
| 5,767,570 A | * | 6/1998 | Rostoker | 257/668 |
| 6,020,636 A | * | 2/2000 | Adishian | 257/728 |
| 6,670,216 B2 | * | 12/2003 | Strauch | 438/106 |
| 6,812,553 B2 | * | 11/2004 | Gerbsch et al. | 257/673 |
| 6,963,133 B2 | * | 11/2005 | Teshima | 257/718 |
| 2002/0163070 A1 | | 11/2002 | Choi | |
| 2003/0132511 A1 | | 7/2003 | Gerbsch et al. | |

OTHER PUBLICATIONS

EP Search Report Dated Jun. 30, 2006.

* cited by examiner

*Primary Examiner*—Luan Thai
(74) *Attorney, Agent, or Firm*—Jimmy L. Funke

(57) ABSTRACT

A process for producing a circuit component having a double-sided circuit device between a pair of substrates. The process entails depositing a solder material on contact areas on surfaces of the substrates, placing a first of the substrates within a cavity in a receptacle, and then placing a lead member on the substrate so that the lead member is supported by the receptacle and a portion of the lead member is aligned with a portion of the contact area of the substrate. A fixture is then placed on the lead member and over the substrate so that the fixture is supported by the receptacle. After aligning the circuit device with the contact area of the remaining substrate, the substrate-device assembly is placed in an aperture in the fixture so that a surface of the device electrically contacts the contact area of the first substrate and the opposite surface of the device electrically contacts the contact area of the second substrate. The resulting fixtured assembly then undergoes reflow.

18 Claims, 3 Drawing Sheets

PROCESS FOR ASSEMBLING A DOUBLE-SIDED CIRCUIT COMPONENT

BACKGROUND OF THE INVENTION

The present invention generally relates to circuit board components, and more particularly to processes for assembling and reflow soldering a double-sided circuit component to a pair of opposing substrates.

Various types of circuit board components have been specifically developed for high current and high power applications, such as hybrid and electric vehicles. Such components often comprise a semiconductor device, such as a diode, thyristor, MOSFET (metal oxide semiconductor field effect transistor), IGBT (isolated gate bipolar transistor), resistors, etc., depending on the particular circuit and use desired. Vertical devices are typically formed in a semiconductor (e.g., silicon) die having metallized electrodes on its opposite surfaces, e.g., a MOSFET or IGBT with a drain/collector electrode on one surface and gate and source/emitter electrodes on its opposite surface. The die is mounted on a conductive pad for electrical contact with the drain/collector electrode, with connections to the remaining electrodes on the opposite surface often being made by wire bonding. The pad and wires are electrically connected to a leadframe whose leads project outside a protective housing that is often formed by overmolding the leadframe and die.

Components of the type described above include well-known industry standard package outlines, such as the T0220 and T0247 cases, which are prepackaged integrated circuit (IC) components whose leads are adapted for attachment (e.g., by soldering) to a printed circuit board (PCB). The overmolded housings of these packages protect the die, wire bonds, etc., while typically leaving the lower surface of the conductive pad exposed to provide a thermal and/or electrical path out of the package. Such a path allows the package to be connected to an electrical bus for electrical connection to the PCB, or a heat-sinking mass for dissipating heat from the package. If electrical isolation of the path is necessary, a non-electrically conductive heat-sinking pad is provided between the package and heat-sinking mass. In doing so, the heat-sinking pad increases the thermal resistance of the path, typically on the order of 0.1 to 0.5° C./watt.

A further drawback of packages of the type described above is their size. As an example, in certain high current hybrid vehicle applications, arrays of packages containing MOSFET's in a three-phase configuration are utilized, with two or three devices in parallel per switch. The resulting assembled array may contain, for example, sixteen to twenty-four packages, requiring a relatively large area on the PCB. In high current, high voltage (e.g., 150 to 400 V) hybrid vehicle applications, this situation is exacerbated by the need for paired sets of IGBT's and diodes, with the resulting assembled array twice as many individual packages.

As a solution to the above, commonly-assigned U.S. Pat. No. 6,812,553 to Gerbsch et al. and U.S. patent application Ser. No. 10/707,005 (U.S. Patent Publication 2004/0094828) to Campbell et al. disclose double-sided circuit devices that are packaged between a pair of substrates in such a way as to reduce the overall size of the resulting component while also meeting both current and thermal management requirements. There is a need for assembly processes suitable for mass-producing these and other double-sided circuit components.

BRIEF SUMMARY OF THE INVENTION

The present invention provides a process suitable for mass-producing a double-sided circuit component. The process entails assembling and reflow soldering a double-sided circuit device between a pair of substrate members without the use of separate packaging, wire bonds, etc., that would increase the complexity and size of the component and hinder thermal management of the device.

The process entails depositing a solder material on first surfaces of first and second substrate members, each of which is formed of an electrically-nonconductive material and comprises at least one electrically-conductive area on the first surface on which the solder material is deposited and a second surface oppositely disposed from the first surface thereof. The first substrate member is then placed within a cavity in a receptacle, and a lead member is placed on the first substrate member so that the lead member is supported by the receptacle and a portion of the lead member is aligned with a portion of the electrically-conductive area of the first substrate member. A fixture is then placed on the lead member and over the first substrate member so that the fixture is supported by the receptacle. After aligning a circuit device with the electrically-conductive area of the second substrate member to yield a preliminary assembly, the preliminary assembly is placed in an aperture in the fixture so that a first surface of the circuit device electrically contacts the electrically-conductive area of the first substrate member and a second surface of the circuit device electrically contacts the electrically-conductive area of the second substrate member.

The resulting fixtured assembly, comprising the first and second substrate members, the receptacle, the lead member, the fixture, and the circuit device, is then heated to cause the solder material to melt, flow, and wet the electrically-conductive areas of the first and second substrate members, the portion of the lead member, and the first and second surfaces of the circuit device. Cooling the fixtured assembly yields the double-sided circuit component in which the electrically-conductive area of the first substrate member is solder bonded to the first surface of the circuit device, the electrically-conductive area of the second substrate member is solder bonded to the second surface of the circuit device, and the portion of the lead member is solder bonded to the first and second substrate members so as to be electrically coupled with at least one of the electrically-conductive areas of the first and second substrate members.

In view of the above, the process of this invention is capable of producing the double-sided circuit component in a manner that is suitable for use in high-volume manufacturing with high yields.

Other objects and advantages of this invention will be better appreciated from the following detailed description.

DETAILED DESCRIPTION OF THE INVENTION

Figure 1:
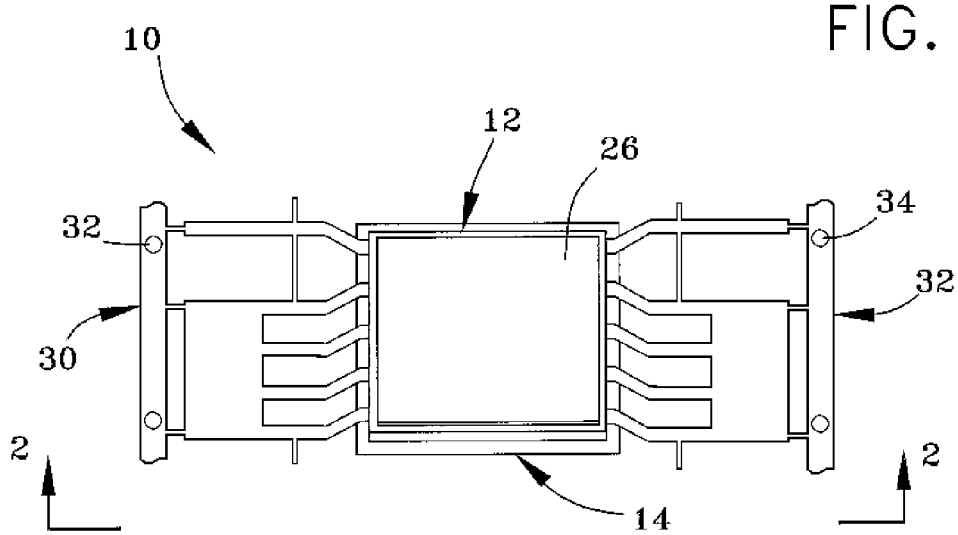
FIGS. 1 and 2 are top and side views, respectively, of a double-sided component that can be produced with a process in accordance with the present invention.
Figure 2:
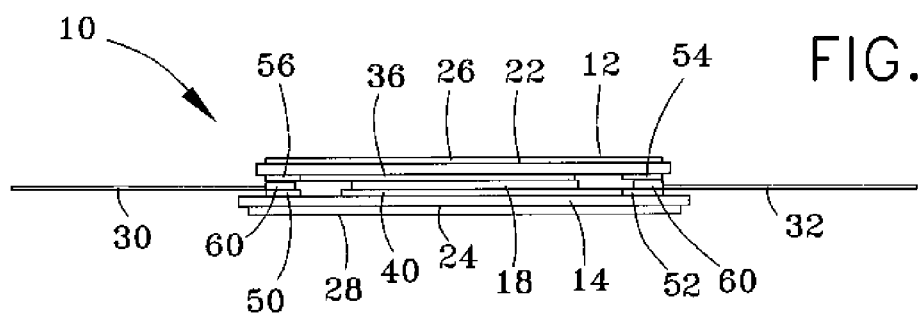
Figure 3:
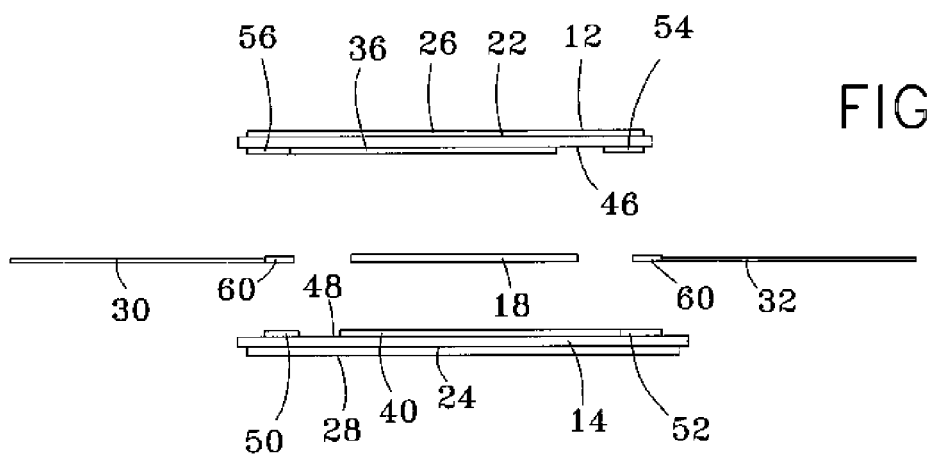
FIG. 3 is an exploded view of the component of FIG. 2.

A double-sided circuit component 10 suitable for use in a process according to the present invention is shown in FIGS. 1 through 3. The component 10 is shown as comprising a pair of substrates 12 and 14, a circuit device 18, and two sets of leads 30 and 32. From the following it will be appreciated that the component 10 shown in the Figures is intended to be representative of the type of component that can be produced by a process within the scope of the invention, and that the number, configuration, and orientation of the elements of the component 10 can differ from that shown in the Figures, e.g., multiple circuit devices. Examples include the circuit devices disclosed in commonly-assigned U.S. Pat. No. 6,812,553 to Gerbsch et al. and U.S. patent application Ser. No. 10/707,005 (U.S. Patent Publication 2004/0094828) to Campbell et al.

If the component 10 is to be used in a high current and high power application, such as a hybrid or electric vehicle, the substrates 12 and 14 are preferably formed of an electrically-nonconductive material, preferably a ceramic material of the type commonly used in electronic systems such as alumina ($Al_2O_3$), aluminum nitride (AlN), silicon nitride (SiN), beryllium oxide (BeO), or an insulated metal substrate (IMS) material. Ceramic materials vary in thermal performance, such that the selection of a particular ceramic material for the substrates 12 and 14 will depend at least in part on the thermal requirements of the specific application for the component 10. Consistent with a high current/power application, each of the outward-facing surfaces 22 and 24 of the substrates 12 and 14 is shown as having an outer layer 26 and 28, respectively, of thermally-conductive material. The outer layers 26 and 28 may be formed of a solderable material, such as copper, copper alloy, plated (e.g., NiAu) aluminum, etc., to permit soldering of the component 10 to heatsinks (not shown) or other suitable structures. If solder is not required for attachment, such as pressure attachment, other materials can be used for the outer layers 26 and 28. Furthermore, it is foreseeable that the outer layers 26 and 28 could be eliminated, with the benefit of reducing the thermal resistance of the thermal path through these layers 26 and 28, and therefore reduced component temperature.

The device 18 may be, for example, a diode, IGBT, MOSFET, or a combination of these devices could be used if more than one device 18 is included in the component. For convenience, the device 18 will be described as a MOSFET, and as such is preferably formed in a semiconductor die, such as silicon. One or more electrodes (not shown) are formed on the upper and lower surfaces of the device. For example, a drain electrode on the lower surface and gate and source electrodes on the upper surface. The device 18 is configured to be mounted between the substrates 12 and 14 so that the drain electrode electrically contacts a conductive pad 40 on the lower substrate 14 and the gate and source electrodes make electrical contact with conductive pads 36 (only one of which is shown) on the upper substrate 14. To accommodate multiple MOSFET's or other combinations of devices, only minor changes to the substrates 12 and 14 and leads 30 and 32 would be required, as will become evident.

Electrical connections of the leads 30 and 32 to the electrodes of the device 18 are achieved through electrically-conductive contact areas 36 and 40 defined on the inward-facing surfaces 46 and 48 of the substrates 12 and 14, respectively. On the substrate 12, an appropriate number of contact areas 36 are defined to individually register with the electrodes on the upper surface of the device 18, such as the source and gate electrodes of a MOSFET. Similarly, an appropriate number of contact areas 40 are provided on the substrate 14 for registration with the number of electrodes on the lower surface of the device 18, such as the drain electrode of a MOSFET. Electrically-conductive bonding between the areas 36 and 40 and their respective electrodes is preferably achieved with solder connections. The contact areas 36 and 40 on the substrates 12 and 14 can each be formed by a single conductive layer, e.g., a copper foil, that is patterned or divided by solder stops. The configurations of the areas 36 and 40 can be modified and solder stops used to match the geometry of a variety of integrated circuit devices incorporated into the component 10.

The leads 30 and 32 are adapted for connecting the component 10 to an electrical bus or other device utilized in the particular application. The leads 30 and 32 can be formed of stamped copper or copper alloy, though other methods of construction are possible. The leads 30 and 32 are depicted as being of a type suitable for use in high current applications (e.g., 200 amperes). For lower current applications, individual lead pins can be used. Each lead 30 and 32 is shown as comprising a plurality of fingers 60 through which physical connection is made to the component 10 and electrical connection is made to the electrodes of the device 18. In the embodiment shown, the lead 30 is electrically coupled to the electrode(s) on the upper surface of the device 18 through bond pads 56 on the upper substrate 12 and also bonded to the lower substrate 14 through electrically-isolated bond pads 50 on the lower substrate 14, and the lead 32 is electrically coupled to the electrode(s) on the lower surface of the device 18 through bond pads 52 on the lower substrate 14 and also bonded to the upper substrate 12 through electrically-isolated bond pads 54 on the upper substrate 12. The pads 50, 52, 54, and 56 can be patterned from the same conductive layers as the areas 36 and 40 on the substrates 12 and 14. The leads 30 and 32 are preferably soldered to their bond pads 50, 52, 54, and 56.

In view of the above construction, the component 10 conducts current and uniformly extracts current across its entire face, instead of wire bond connection sites, and therefore has the ability to carry higher currents with less temperature rise than conventional wire bonded and ribbon bonded devices. Also by avoiding wire and ribbon bonding techniques, the component 10 can be readily adapted to enclose various types and configurations of devices. The component 10 also has the advantage of being able to dissipate heat in two directions, namely, up through the upper substrate 12 and/or down through the lower substrate 14. If both substrates 12 and 14 are used to dissipate heat, the temperature rise of the component 10 can potentially be reduced by about one-half. The solderable outer layers 26 and 28 of the substrates 12 and 14 are isolated from the circuit device 18 by the substrates 12 and 14. By providing electrically-isolated top and bottom surfaces in this manner, the need for discrete heatsink electrical-isolation pads can be avoided.

It can also be seen from the above that the component 10 does not require a plastic overmold, in that the circuit device 18 is protectively enclosed by the substrate 12 and 14. Avoiding a plastic overmold reduces internal differences in coefficients of thermal expansion (CTE) within the component 10, as well as CTE mismatches with components and substrates contacting by the component 10, thereby improving component life during temperature cycling. If desired, a compliant dielectric encapsulating material can be placed around the perimeter of the component package to seal the edges of the substrates 12 and 14 and the gap therebetween, thereby protecting against contaminant intrusion and improving the electrical isolation properties of the package.

Figure 4:
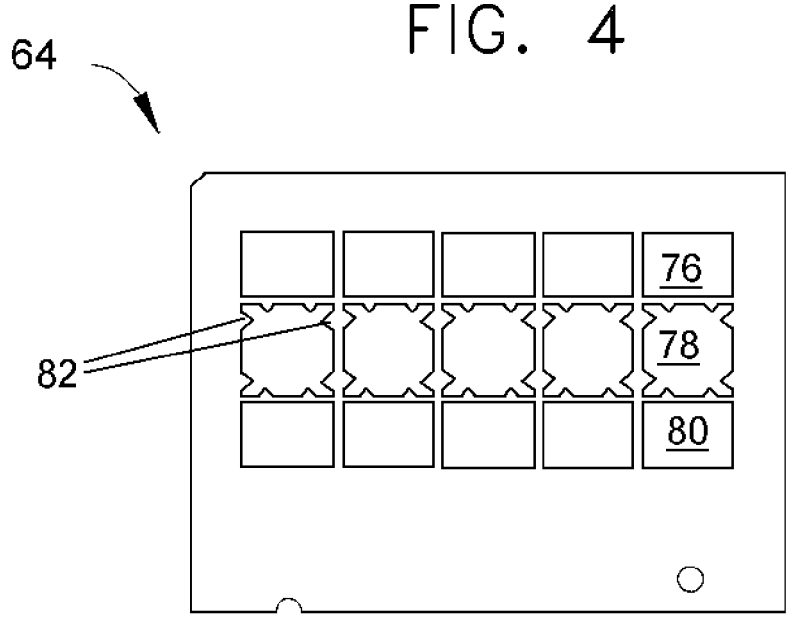
FIGS. 4 and 5 are plan views of a fixture and boat configured for use in the process of the present invention.
Figure 5:
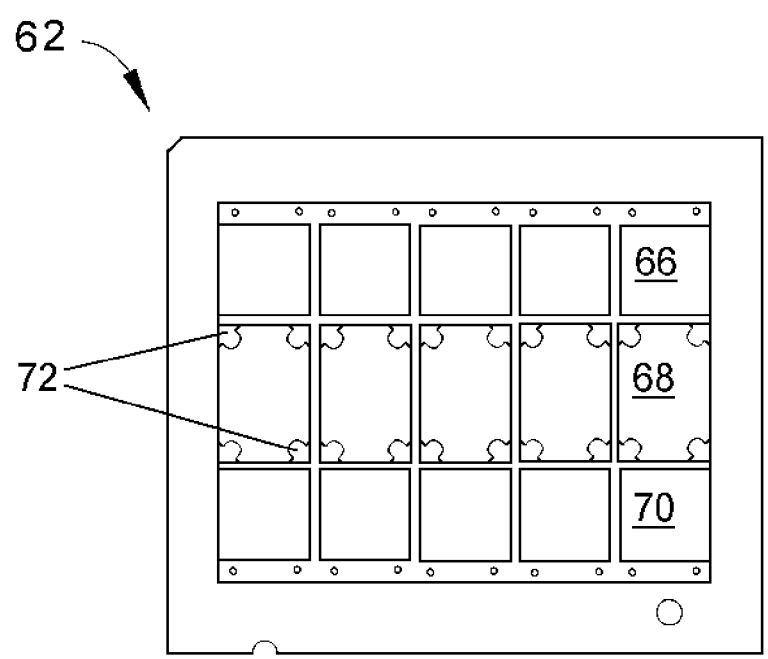
Figure 6:
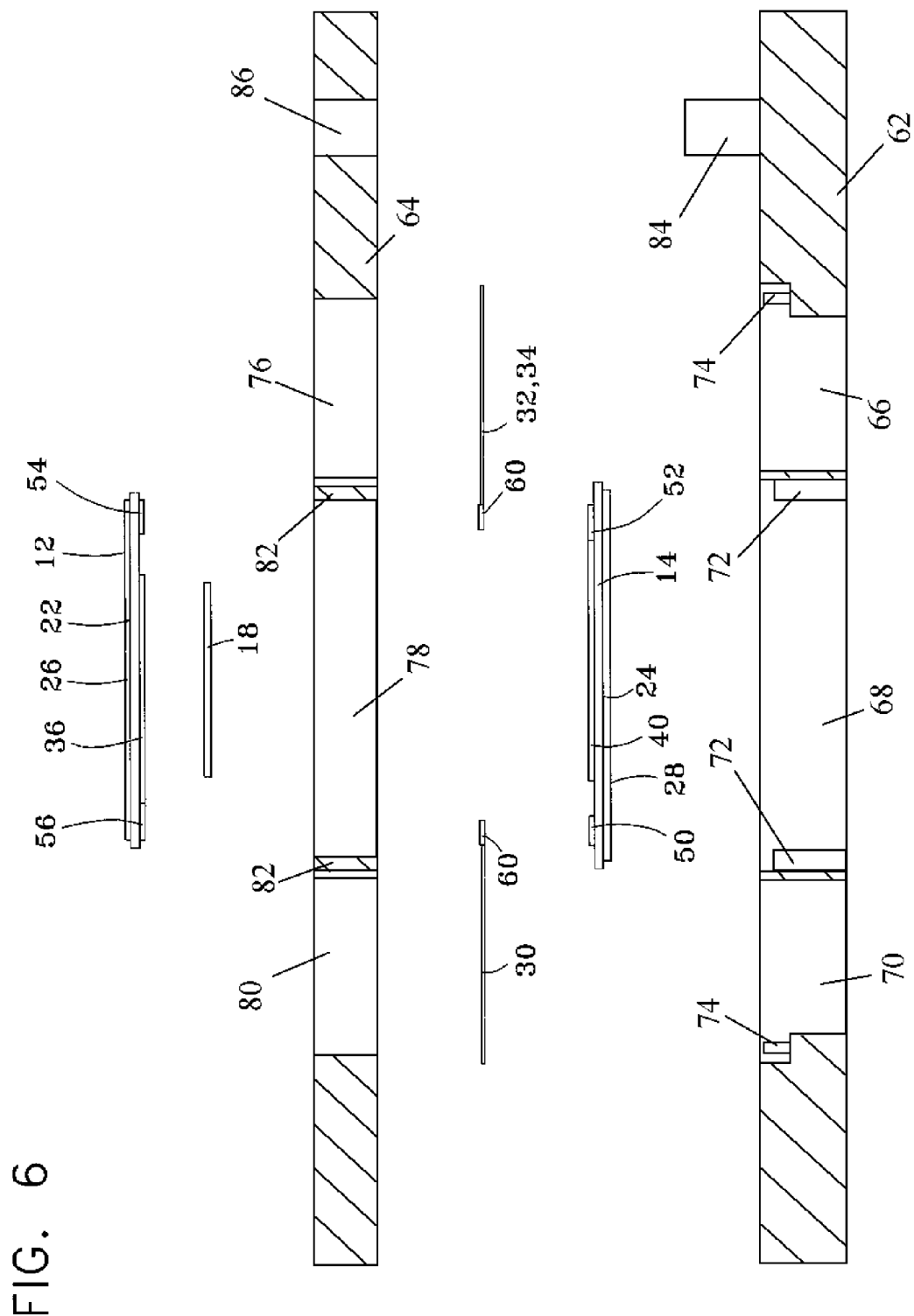
FIG. 6 is an exploded view of the components of FIGS. 3, 4 and 5 as arranged for undergoing the process of the present invention.

A process for assembling and soldering the parts of the component 10 is represented in FIG. 6, with two tools 62 and 64 for supporting the components 10 during assembly being represented in FIGS. 4 and 5. The first tool 62 is a boat specially adapted for the present invention but otherwise generally of the type known for use in reflow processes performed in a belt furnace. For use in the invention, the boat 62 is formed to have any number of sets of three cavities 66, 68, and 70, with the center cavity 68 provided with support pedestals 72. The boat 62 is also provided with location pins 74 adjacent the cavities 66 and 70, and an alignment pin 84 by which the second tool, hereinafter a fixture 64, is aligned with the boat 62. The fixture 64 is formed to have sets of three aperture 76, 78, and 80 corresponding in number to the cavities 66, 68, and 70 of the boat 62, with the center cavity 78 provided with support pedestals 82. The fixture 64 is also provided with an alignment hole 86 for mating with the alignment pin 84 of the boat 62.

The process of assembling and soldering the double-sided circuit component 10 of FIGS. 1 through 3 generally entails depositing a solder paste on the contact areas 36 and 40 and bond pads 50, 52, 54, and 56 of the substrates 12 and 14. The substrate 14 is then placed within one of the center cavities 68 in the boat 62 so as to be supported within the cavity 68 by the recessed pedestals 72. The leads 30 and 32 are then placed on the boat 62 to span the cavities 66 and 70 thereof and so that their fingers 60 are individually aligned with the bond pads 50 and 52 of the substrate 14, the alignment of which is assured by mating location holes 34 of the leads 30 and 32 with the location pins 74 of the boat 62. The fixture 64 is then placed on the leads 30 and 32 and over the substrate 14 so that the fixture 64 is supported by the boat 62 and its alignment hole is mated with the alignment pin 84 on the boat 62. The portions of the fixture 64 separating the center aperture 78 from the other apertures 76 and 80 preferably contact and immobilize the leads 30 and 32 adjacent their fingers 60, and the rim of the fixture 64 preferably contacts and immobilizes the portions of the leads 30 and 32 in which the location holes 34 are formed.

The next step is to position the substrate 12 with its surface 46 facing up, orient the device 18 so that its upper surface (as viewed in FIGS. 2, 3, and 6) is facing down, align the electrode(s) on the upper surface of the device 18 with the contact area 36 of the substrate 12, and then physically place the device 18 on the substrate 12 to yield what may be termed a preliminary assembly. The preliminary assembly is then inverted to be device-down (as seen in FIGS. 2, 3, and 6) and placed in the center aperture 78 of the fixture 64 so that the substrate 12 is supported within the aperture 78 by the pedestals 82, the electrode(s) on the lower surface of the device 18 electrically contact the contact area 40 of the substrate 14, and the bond pads 54 and 56 on the substrate 12 contact the fingers 60 of the leads 30 and 32 so that the fingers 60 of the leads 30 and 32 are between aligned pairs of the bond pads 50, 52, 54 and 56.

It can be appreciated that the process described above can be performed to simultaneously place parts in the boat 62 and fixture 64 to produce four additional components 10, and that any number of components 10 could be processed by fabricating the boat 62 and fixture 64 to have the desired number of cavities 66, 68, and 70 and apertures 76, 78, and 80. The fixtured assembly is then ready for a solder reflow operation, such as by transporting the boat 62 and the parts supported thereby through a belt oven. Notably, the individual parts of the component 10 are supported and held together with the boat 62 and 64 solely under the force of gravity. During reflow, the solder paste that was deposited on the contact areas 36 and 40 and bond pads 50, 52, 54, and 56 of the substrates 12 and 14 melts, flows, and wets the contact areas 36 and 40 and the bond pads 50, 52, 54, and 56, the electrodes of the device 18 aligned with the contact areas 36 and 40, and the fingers 60 of the leads 30 and 32 aligned with the bond pads 50, 52, 54, and 56. Upon cooling the fixtured assembly, the molten solder forms solder connections that solder bond the contact area 36 and 40 of the substrates 12 and 14 to the electrodes of the device 18 and the fingers 60 of the leads 30 and 32 to their respective pairs of bond pads 50, 52, 54, and 56.

While the invention has been described in terms of a preferred embodiment, it is apparent that other forms could be adopted by one skilled in the art. Accordingly, the scope of the invention is to be limited only by the following claims.

What is claimed is:

1. A process of producing a double-sided circuit component, the process comprising:

depositing a solder material on surfaces of first and second substrate members, each of the first and second substrate members being formed of an electrically-nonconductive material and comprising at least one electrically-conductive area on the surface on which the solder material is deposited;

placing the first substrate member within a cavity in a receptacle;

placing a lead member on the first substrate member so that the lead member is supported by the receptacle and a portion of the lead member is aligned with a portion of the electrically-conductive area of the first substrate member;

placing a fixture on the lead member and over the first substrate member so that the fixture is supported by the receptacle;

aligning a circuit device with the electrically-conductive area of the second substrate member to yield a preliminary assembly;

placing the preliminary assembly in an aperture in the fixture so that a first surface of the circuit device electrically contacts the electrically-conductive area of the first substrate member and a second surface of the circuit device electrically contacts the electrically-conductive area of the second substrate member, thereby yielding a fixtured assembly comprising the first and second substrate members, the receptacle, the lead member, the fixture, and the circuit device;

heating the fixtured assembly to cause the solder material to melt, flow, and wet the electrically-conductive areas of the first and second substrate members, the portion of the lead member, and the first and second surfaces of the circuit device; and then cooling the fixtured assembly to yield the double-sided circuit component in which the electrically-conductive area of the first substrate member is solder bonded to the first surface of the circuit device, the electrically-conductive area of the second substrate member is solder bonded to the second surface of the circuit device, and the portion of the lead member is solder bonded to the first and second substrate members so as to be electrically coupled with at least one of the electrically-conductive areas of the first and second substrate members.

2. The process according to claim 1, wherein during the step of placing of the lead member on the first substrate member and the receptacle, the lead member is located on the receptacle with location pins on the receptacle.

3. The process according to claim 1, wherein the first substrate member is supported within the cavity of the receptacle with recessed pedestals within the cavity.

4. The process according to claim 1, wherein the second substrate member is supported within the aperture of the fixture with pedestals within the aperture.

5. The process according to claim 1, wherein the fixture contacts and immobilizes the lead member adjacent the portion thereof.

6. The process according to claim 5, wherein the fixture contacts and immobilizes a region of the lead member oppositely disposed from the portion thereof.

7. The process according to claim 1, wherein during the heating and cooling steps the receptacle supports the first and second substrate members, the lead member, the fixture, and the circuit device solely under the force of gravity.

8. The process according to claim 1, wherein the circuit device is a field effect transistor, the first and second surfaces of the circuit device contain a source, gait and drain of the field effect transistor, and the process results in the source, gait, and drain being solder bonded to separate electrically-conductive areas on the surfaces of the first and second substrate members.

9. The process according to claim 1, wherein the double-sided circuit component is one of a plurality of substantially identical double-sided circuit components produced with the fixture and the receptacle during the process.

10. A process of producing a double-sided circuit component, the process comprising:
depositing a solder paste on surfaces of first and second substrate members, each of the first and second substrate members being formed of an electrically-non-conductive material and comprising at least one electrically-conductive area and a plurality of bond pads on which the solder paste is deposited;
placing the first substrate member within a cavity in a receptacle;
placing a pair of lead members on the receptacle so that a portion of each of the lead members is individually aligned with one of the bond pads of the first substrate member;
placing a fixture on the lead members and over the first substrate member so that the fixture is supported by the receptacle;
aligning a circuit device with the at least one electrically-conductive area of the second substrate member to yield a preliminary assembly;
placing the preliminary assembly in an aperture in the fixture so that at least one electrode on a first surface of the circuit device electrically contacts the at least one electrically-conductive area of the first substrate member, at least one electrode on a second surface of the circuit device electrically contacts the at least one electrically-conductive area of the second substrate member, and the portions of the lead members are between aligned pairs of the bond pads of the first and second substrates, thereby yielding a fixtured assembly comprising the first and second substrate members, the receptacle, the lead members, the fixture, and the circuit device;
heating the fixtured assembly to cause the solder paste to melt, flow, and wet the electrically-conductive areas and the bond pads of the first and second substrate members, the portions of the lead members, and the electrodes on the first and second surfaces of the circuit device; and then
cooling the fixtured assembly to yield the double-sided circuit component in which the at least one electrically-conductive area of the first substrate member is solder bonded to the at least one electrode on the first surface of the circuit device, the at least one electrically-conductive area of the second substrate member is solder bonded to the at least one electrode on the second surface of the circuit device, and the portions of the lead members are individually solder bonded to the pairs of the bond pads of the first and second substrate members.

11. The process according to claim 10, wherein during the step of placing of the lead member on the first substrate member and the receptacle, the lead member is located on the receptacle with location pins on the receptacle.

12. The process according to claim 10, wherein the first substrate member is supported within the cavity of the receptacle with recessed pedestals within the cavity.

13. The process according to claim 10, wherein the second substrate member is supported within the aperture of the fixture with pedestals within the aperture.

14. The process according to claim 10, wherein the fixture contacts and immobilizes the lead members adjacent the portions thereof.

15. The process according to claim 14, wherein the fixture contacts and immobilizes a region of the lead members oppositely disposed from the portions thereof.

16. The process according to claim 10, wherein during the heating and cooling steps the receptacle supports the first and second substrate members, the lead members, the fixture, and the circuit device solely under the force of gravity.

17. The process according to claim 10, wherein the circuit device is a field effect transistor, the first and second surfaces of the circuit device contain a source, gait and drain of the field effect transistor, and the process results in the source, gait, and drain being solder bonded to separate electrically-conductive areas on the surfaces of the first and second substrate members.

18. The process according to claim 10, wherein the double-sided circuit component is one of a plurality of substantially identical double-sided circuit components produced with the fixture and the receptacle during the process.

* * * * *